United States Patent [19]

Davis

[11] 3,904,933

[45] Sept. 9, 1975

[54] COOLING APPARATUS FOR ELECTRONIC MODULES

[75] Inventor: Ronald E. Davis, Chippewa Falls, Wis.

[73] Assignee: Control Data Corporation, Minneapolis, Minn.

[22] Filed: Oct. 23, 1974

[21] Appl. No.: 517,351

[52] U.S. Cl................... 317/100; 165/80; 174/15 R

[51] Int. Cl.$^2$........................................... H05K 7/20

[58] Field of Search...317/100, 117, 101 CM, 101 CB, 317/101 DH, 101 D; 174/DIG. 5, 15 R; 165/76, 80, 185; 339/17 LM, 17 M, 17 N, 112 R, 112 L

[56] References Cited

UNITED STATES PATENTS

| | | | |
|---|---|---|---|
| 3,648,113 | 3/1972 | Rathjen | 317/100 |
| 3,735,206 | 5/1973 | Pesek | 317/101 DH |
| 3,865,183 | 2/1975 | Roush | 165/80 |

*Primary Examiner*—Gerald P. Tolin
*Attorney, Agent, or Firm*—Robert M. Angus

[57] ABSTRACT

An electronic circuit module is housed in a thermally conductive housing having fluid conduits therein for carrying coolant. The circuit module includes a stack of a plurality of circuit boards supported in the housing, each circuit board having a thermally conductive member attached to opposite side portions thereof, each member having a sawtooth edge portion. A plurality of cooling bars are sandwiched between a wall of the housing and the side members of the stack, each bar including a surface adapted to abut the inner surface of the wall and a sawtooth portion for abutting the sawtooth portion of an individual circuit board. Torque means, such as a threaded fastener, is provided for moving the plurality of cooling bars to wedge the same between the individual members and the wall to establish good thermal connection between the coolant in the fluid conduits and the circuit boards.

10 Claims, 5 Drawing Figures

COOLING APPARATUS FOR ELECTRONIC MODULES

This invention relates to circuit module assemblies, and particularly to apparatus for cooling circuit boards of a circuit module assembly.

A circuit element (for example, a resistor, capacitor, or semiconductive device, or the like) dissipates power during operation, thereby generating heat. Prior to about 1940, the heat dissipated from electronic elements was not a significant problem due to the relatively low density of circuit packaging. However, as the state of the electronics art advanced, circuit packaging became more dense and a need developed for inclusion of cooling apparatus for dissipating heat generated by power dissipation. Early examples of such cooling techniques included simple ventilation apertures in housings and/or chassis to allow the free flow or ambient air around the circuit elements. However, as the density of circuit modules further increased, the requirement for more advanced cooling techniques likewise increased. Thus, computer modules of the late 1940's and early 1950's included suitable ventilation apparatus, such as fans, blowers and the like, to circulate ambient air through the circuit modules to thereby cool the same by forced air convection.

As the state of the electronic packaging art advanced, greater need arose for more adequate and sophisticated cooling techniques for cooling circuit modules of more densely packaged circuits. For example, U.S. Pat. No. 3,334,684 granted Aug. 8, 1967 to Maurice D. Roush et al for "Cooling System For Data Processing Equipment," describes a cooling system for circuit modules utilizing a coolant or refrigerant circulated adjacent the modules to transfer heat therefrom by conduction and convection, the coolant being circulated through a refrigeration system.

One problem associated with cooling techniques for circuit modules has resided in the fact that circuit modules ordinarily comprise a plurality of circuit boards which must be cooled. Although numerous approaches have been advanced for cooling individual circuit boards of circuit modules, none have been completely effective in meeting current requirements of circuit density and heat dissipation.

In the copending application of Maurice D. Roush, Ser. No. 408,887 filed Oct. 23, 1973, entitled "Cooling System For Electronic Circuit Modules", now U.S. Pat. No. 3865183, granted Feb. 11, 1975 and assigned to the same assignee as the present invention, there is described an improved cooling system wherein sawtoothed-shaped cooling bars are matched to a stack of circuit boards having sawtoothed-shaped edge portions for efficient heat transfer between the circuit boards and the cooling media. However, one problem with the approach set forth in the Roush application resides in assuring that a fully planar sawtooth edge is maintained across the entire stack of a plurality of such boards. Minor differences in the lateral position of the sawtooth edge members of each board will distort the resulting planes, making it difficult to maintain intimate contact between the cooling bar and each board. The present invention, therefore, is concerned with an improvement of the apparatus described in the aforementioned Roush application, and the disclosure of the Roush application is herein incorporated by reference.

It is an object of the present invention to provide cooling apparatus for a circuit module which exhibits more efficient heat transfer characteristics between the coolant and the individual circuit boards of the module.

It is another object of the present invention to provide a cooling system for a circuit module wherein each circuit board of the module is held rigidly contiguous a cooling medium.

It is yet another object of the present invention to provide a cooling technique which utilizes cooling bars adapted to be snuggly fitted between individual circuit boards and a housing carrying coolant so as to provide efficient heat transfer characteristics between the coolant and the circuit boards, thereby cooling the boards.

In accordance with the present invention, a circuit module includes a housing, or chassis, having fluid conduit means disposed therein for carrying coolant. A plurality of individual circuit boards are stacked within the housing, each having a thermally conductive member attached to the opposite edges thereof, the member having at least one nominal edge of irregular shape, such as a sawtooth edge. A plurality of cooling bars are positioned within the housing, each bar having a surface of irregular shape adapted to engage in irregular, or sawtooth, surface of one of the heat conductive members. Engaging means is provided for engaging the cooling bars to wedge the same between each thermally conductive members and the housing.

In accordance with one feature of the present invention, the irregular shapes of the cooling bars and the heat conductive members are generally sawtoothed so as to define heat transfer interface surfaces therebetween disposed at an angle to a nominal surface of the irregular edge, and the engaging means includes a fastener or the like, adapted to bias the heat conductive bars to sandwich or wedge them between the housing and circuit boards.

In accordance with yet another feature of the present invention, a carriage is provided to hold and position the stack of cooling bars therein, and the engaging means engages the carrier to simultaneously position the individual cooling bars. Each cooling bar is individually positionable in the carriage so that minor differences in the lateral position of the circuit boards is compensated for by selectively positioning each cooling bar in the carriage.

The above and other features of this invention will be more fully understood from the following detailed description and the accompanying drawings, in which.

Figure 1:
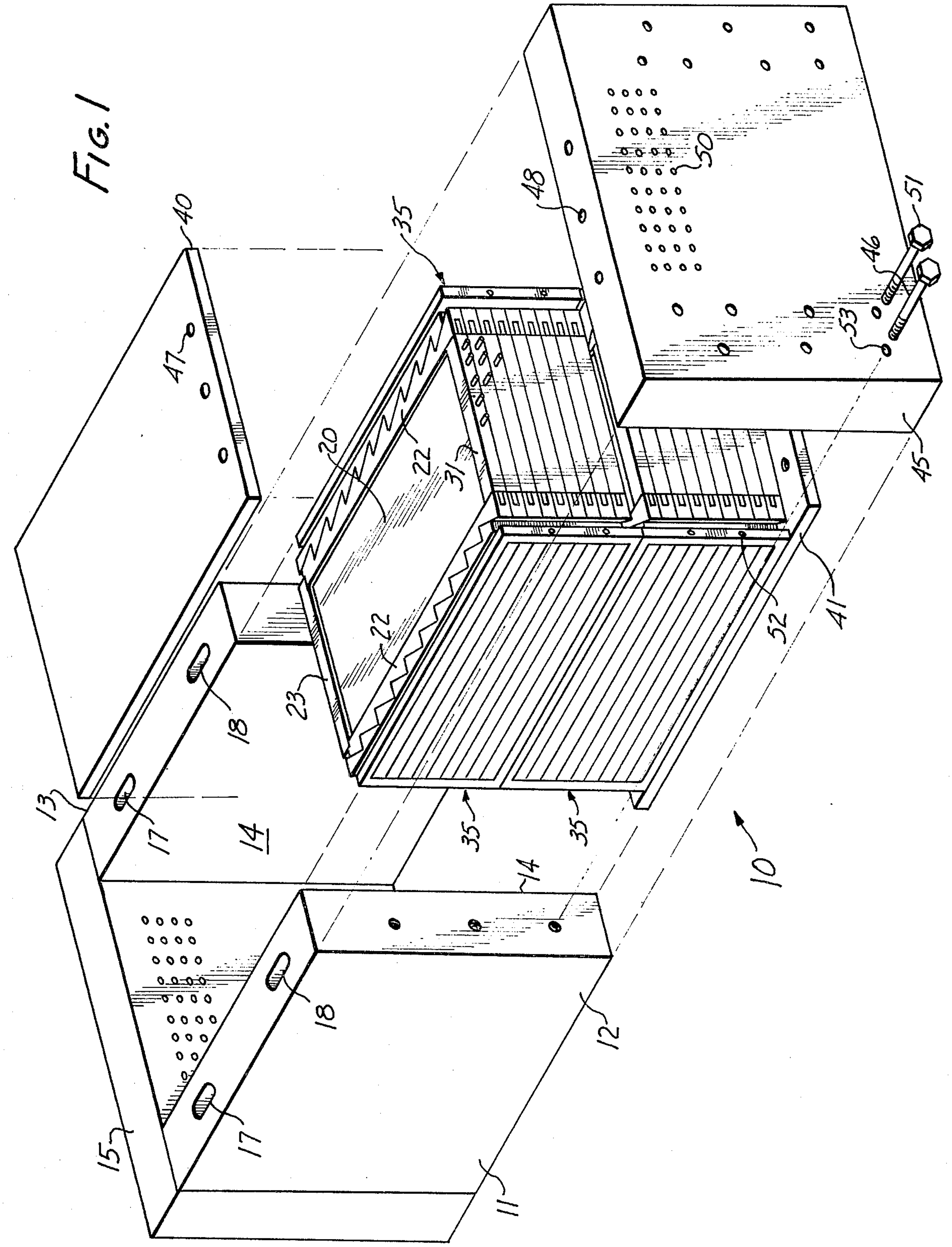
FIG. 1 is an exploded perspective view of a circuit module in accordance with the presently preferred embodiment of the present invention.

Referring to the drawings, there is illustrated a circuit module 10 comprising a housing 11 having opposite side walls 12 and 13. Each wall 12, 13 includes substantially planar inner surface 14. The rear of housing 11 is closed by a suitable plate 15 fastened to walls 12 and 13, and having a suitable receptacle therein.

Fluid conduits 17, 18 are formed in each wall 12, 13 and are disposed through the height thereof to carry a suitable coolant, such as Freon. As will be understood to those familiar with the refrigeration art, fluid conduits 17 and 18 terminate at suitable manifolds (not shown) for connection to a suitable refrigeration system (not shown). For example, such a refrigeration system may include a heat exchanger, condenser and compressor, as more fully explained in the aforementioned Roush et al patent.

Figures 2, 3, 4, 5:
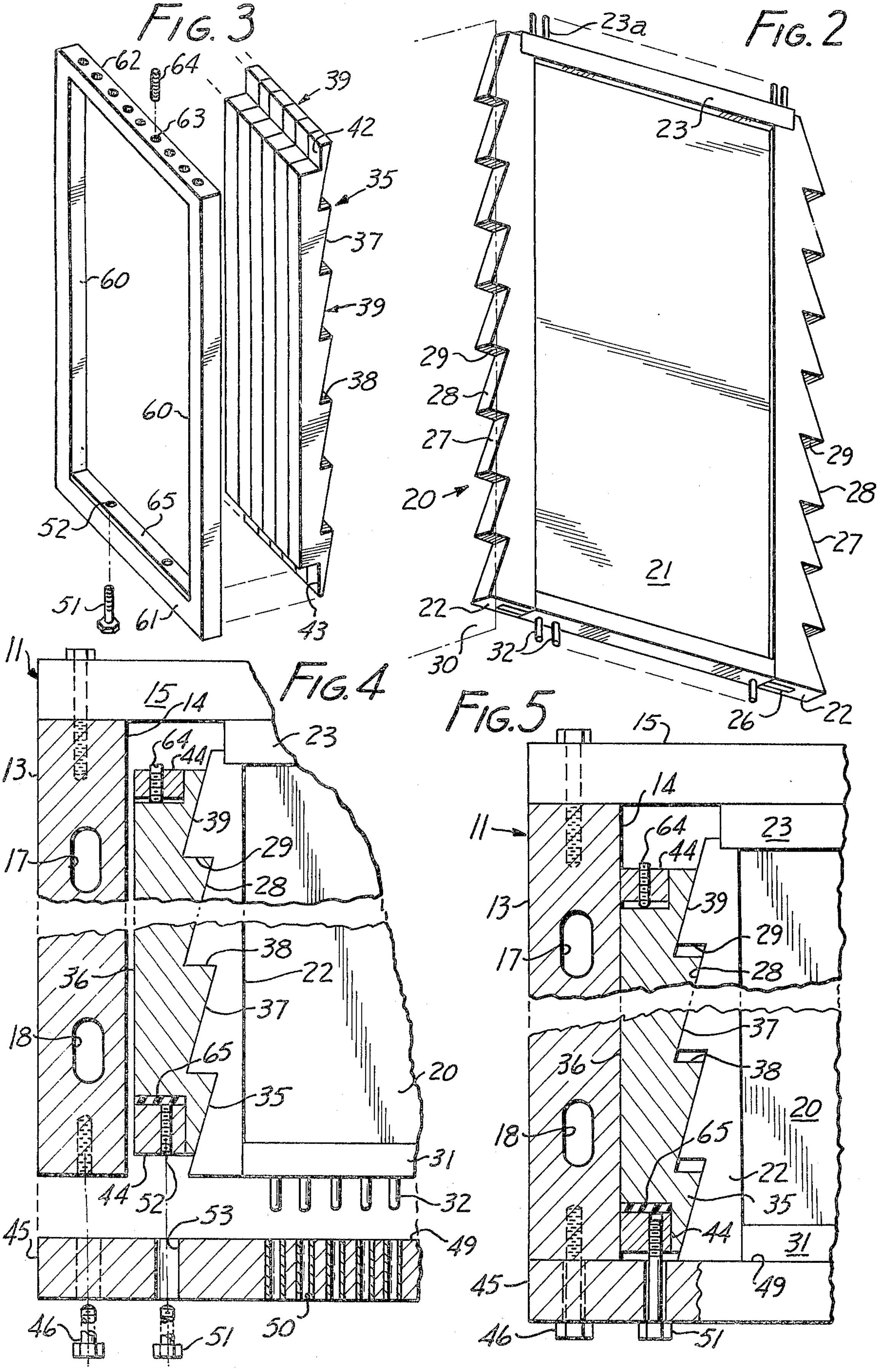
FIG. 2 is a perspective view of a typical circuit board for use in the apparatus illustrated in FIG. 1.
FIG. 3 is an exploded perspective view of a carriage and cooling bar assemblage for use in the apparatus illustrated in FIG. 1.
FIG. 4 is a section view of a portion of the apparatus illustrated in FIG. 1.
FIG. 5 is a section view, as in FIG. 4, showing the apparatus fully assembled.

Referring to FIG. 2, a plurality of circuit cards 20 each comprise a substantially planar substrate 21 whose edges are nested in and fastened to thermally conductive members 22. A rear edge of each circuit board 20 terminates a connector 23 adapted to engage and mate with respective connector receptacle in plate 15. For example, the individual contacts 23*a* of connector 23 are electrically connected to suitable circuit elements 21a mounted to substrate 21. Preferably, the front edge of each circuit card also terminates in a connector 31 having individual contacts 32 electrically connected to selected circuit elements (not shown).

Each substrate 21 may comprise a multilayer circuit board. Conveniently, and as described in the aforementioned Roush application, one layer of the circuit board may be constructed of a suitable thermally conductive material to form an electrical ground plane for the circuit board. Such conductive layer may be thermally attached to member 22 by solder or other suitable thermal connection to form a cold plate within each circuit board.

As shown particularly in FIG. 2, member 22 is slotted at 26 to receive substrate 21, and includes a plurality of sawtooth portions 27, each having a first edge surface 28 disposed at a predetermined angle to the length of member 22 and a second edge surface 29 forming a transition between adjacent surfaces 28 and normal to the nominal edge plane 30, which is parallel to the length of member 22.

As shown particularly in FIGS. 1 and 3–5, spacer means 35 is provided between each member 22 of a circuit board and surface 14. Spacer means 35, comprises a plurality of individual thermally conductive spacer bars 39, each having a first planar surface 36 disposed parallel to nominal plane 30, and a sawtooth portion including first surface portions 37 disposed at a predetermined angle to nominal plane 30 and second surface portions 38 disposed normal to plane 30 to form transitions between adjacent surfaces 37. The sawtooth edge portion formed by surfaces 37 and 38 closely conform to sawtooth edge portion formed by the edge portions 28 and 29 of an individual member 22. For example, the edge portions 28 and 37 disposed at an angle to plane 30 may be disposed at 15° to plane 30 to assure a tight fit as will be more fully understood hereinafter. Each spacer bar includes first and second shoulders 42 and 43, respectively formed at an end of the spacer bar in surface 36. Each spacer bar 39 has a width approximately equalling the width of a member 22.

A carriage, or frame, 44 is provided having individual side members 60 and a front end member 61 and a rear end member 62. End member 61 includes a plurality of threaded apertures 52 for purposes to be more fully explained hereinafter. End member 62 includes a plurality of threaded apertures 63 adapted to receive individual set screw 64. Preferably, a suitable neoprene spacer 65 is positioned adjacent the opposite end member 61.

To assemble the apparatus, a plurality, for example nine, circuit boards are stacked and positioned in a jig (not shown) so that each member 22 is contiguous to the others along their respective upper and lower surfaces. A carriage 44, containing a plurality, for example nine, cold bars 39 nested in the carriage so that end members 61 and 62 are received in shoulders 43 and 42, is positioned adjacent the stack of circuit boards in the jig and set screws 64 are adjusted to laterally position by clamping action each cold bar 39 to bear against spacer 65 relative to the others to obtain an intimate contact between the member 22 of the respective circuit board and the individual cold bar. Upon positioning the relative lateral position along plane 30 of each cold bar 39, the jig is disassembled and the circuit boards are stacked as shown in FIG. 1 so that members 22 are contiguous to each other along their respective upper and lower surfaces. The assembled spacer means 35 comprising the carriage and the individual cold bars are positioned adjacent the edges of the stack of cards formed by the sawtoothed portions of members 22. It should be recognized that the cooling means 35 is loosely coupled to the assemblage and is capable of moving laterally in the assemblage.

The assemblage is thereafter positioned in the U-shaped portion of housing 11 formed by walls 12, 13 and 15 so that connectors 23 engage respective connector receptacles. Thereafter, face plate 45 is fastened to side wall members 12 and 13 by suitable fasteners 46 and to the upper and lower plates 40 and 41 by fasteners (not shown) assembled to recepticals 47 and 48. The finally assembled arrangement is such that the forward of edge of members 22 abut surface 49 of plate 45 so as to fixedly position the circuit boards within the housing to maintain the connection between the contacts on the printed circuit boards and the contacts of the receptacle. As shown particularly in FIGS. 1 and 4, face plate 45 includes a plurality of electrical connectors 50 adapted to engage contacts 32 of connectors 31. Connectors 50, for example, may provide suitable test point connectors for each module.

The threaded portions of fasteners 51 are threadably engaged to threaded portions 52 of carriage 44 through apertures 53 of face plate 45. The heads of fasteners 51 bear against the surface of face plate 45 so that upon axial rotation of fasteners 51, carriage 44 and the individual spacer bars 39 are moved axially thereby causing the spacer bars to be wedged between surfaces 14 of walls 12 and 13 and individual surfaces 28 of members 22. By applying a sufficient torquing force to fasteners 51, for example 20 lbs. of torque, cold bars 39 are tightly wedged between members 22 and walls 12 and 13 thereby providing adequate thermal connection between the members so as to cool members 22 by conduction.

As fasteners 51 are axially rotated to tighten the position of cold bars 39 between the members, carriage 44 and cold bars 39 physically move from the position illustrated in FIG. 4 to that illustrated in FIG. 5 wherein a tight abutment fit is established between surfaces 36 of the cold bars and surface 14 of the housing and between surfaces 37 of the cold bars and surfaces 28 of member 22. The application of the torque force to each fastener 51 assures a tight wedging fit between walls 11, 12 and members 22. The tight abutment fit of cold bars 39 between the members assures adequate thermal connection between the members.

It should be noted that the truncated shape of the sawtoothed cooling bars are tapered such that drawing the cold bars forward toward face plate 45 causes the side surfaces of each cold bar to tightly engage respective surfaces and wall 12, 13 and a member 22. By applying a suitable torque to fasteners 51, for example, 20 pounds torque, a suitable lateral force is applied to the sawtooth surface to wedge each bar 39 into a tight, heat conducting connection between a circuit board 20 and walls 12 and 13 carrying the coolant.

Since members 22 are thermally connected to the ground plane of the printed circuit board, a temperature gradiant is established between the coolant flowing in conduits 17 and 18 and the circuit elements on the circuit boards to cool the circuit elements and the boards.

In a typical application of the present invention, a plurality of circuit boards 21 will be stacked in a single module between spacer means 35. For example, and illustrated particularly in FIG. 1, a module may contain 18 circuit boards comprising two stacks of nine circuit cards each, each stack being disposed between two spacer means 35, each spacer means having nine cold bars 39. Additionally, the circuit boards may be electrically and thermally interconnected as is more fully described in U.S. Pat. No. 3,832,603 granted Aug. 27, 1974 to S. R. Cray and M. D. Roush for "Interconnect Technique for Stacked Circuit Boards" and assigned to the same assignee as the present invention. Such an arrangement is particularly useful for computer modules such as logic apparatus, amplifiers, registers, and the like.

The present invention provides a thermal connection for cooling stacked circuit boards in relatively high density to enable adequate cooling of circuit elements of such circuit boards. The apparatus provides more efficient cooling than theretofore provided by prior techniques.

This invention is not to be limited by the embodiment shown in the drawings and described in the description, which is given by was of example and not of limitation, but only in accordance with the scope of the appended claims.

What is claimed is:

1. An electronic circuit module comprising: a thermally conductive housing supporting a stack of a plurality of substantially planar circuit boards, said housing including side wall members defining internal surfaces;

fluid conduit means disposed in said wall members for containing coolant;

a thermally conductive edge member mounted to a side portion of each of said circuit boards, each edge member having a sawtooth edge portion defining a nominal edge plane of said board, said nominal edge plane being disposed substantially parallel to said internal surface of the respective side wall member, the sawtooth edge portion of each edge member including first surface portions disposed at a predetermined angle to said nominal plane and second edge portions forming transitions between adjacent first edge portions;

thermally conductive spacer means comprising a stack of individual spacers, each of said spacers having a first surface bearing against a respective internal surface and a sawtooth edge portion having surface portions disposed at a predetermined angle to said first surface, and frame means within said housing clamping said stack of spacers for fixedly positioning each of said spacers relative to the other spacers; and engaging means engaging said frame means to move said stack of spacers along said nominal plane thereby wedging each of said conductive spacers between said respective wall member and the respective conductive edge member of an individual circuit board of said stack of circuit boards, the surface portions of said sawtooth edge portions of said spacers bear against the first surface portions of the sawtooth edge portions of said edge members.

2. Apparatus according to claim 1 wherein said frame means comprises a rectangular frame receiving said thermally conductive spacers, and positioning means positioning each of said spacers in said frame.

3. Apparatus according to claim 2 wherein said positioning means comprises a plurality of fasteners threadably assembled to one end of said frame, each of said fasteners bearing against one end portion of a respective spacer.

4. Apparatus according to claim 3 further including resilient spacer means mounted to said frame at an end opposite said one end, an end portion opposite said one end portion of said of said spacers bearing against said resilient spacer means.

5. Apparatus according to claim 4 wherein said housing includes a face plate mounted to said wall members, a forward portion of each of said circuit boards bearing against said face plate.

6. Apparatus according to claim 5 wherein said engaging means comprises threaded fastener means having a head portion engaging said face plate and a threaded portion threadably assembled to said frame means to move said frame means along the axis of said fastener means.

7. Apparatus according to claim 6 wherein an edge member is mounted to opposite side portions of said board, and a spacer means is sandwiched between said opposite edge members of the stack of boards and the housing.

8. Apparatus according to claim 4 wherein an edge member is mounted to opposite side portions of said board, and a spacer means is sandwiched between said opposite edge members of the stack of boards and the housing.

9. Apparatus according to claim 1 wherein said housing includes a face plate mounted to said wall members, a forward portion of each of said circuit boards bearing against said face plate.

10. Apparatus according to claim 9 wherein said engaging means comprises threaded fastener means having a head portion engaging said face plate and a threaded portion threadably assembled to said carrier means to move said carrier means along the axis of said fastener means.

* * * * *

UNITED STATES PATENT OFFICE

CERTIFICATE OF CORRECTION

Patent No. 3,904,933 Dated September 9, 1975

Inventor(s) Ronald E. Davis

It is certified that error appears in the above-identified patent and that said Letters Patent are hereby corrected as shown below:

Col. 5, line 41, for "was" read --way--

Col. 6, line 31 (claim 4, line 4), for "said" (first occurrance) read --each--

Col. 6, line 60 (claim 10, line 4), for "carrier" read --frame--

Col. 6, line 61 (claim 10, line 5), for "carrier" read --frame--

Signed and Sealed this

*sixteenth* Day of *December 1975*

[SEAL]

*Attest:*

RUTH C. MASON
*Attesting Officer*

C. MARSHALL DANN
*Commissioner of Patents and Trademarks*